(12) United States Patent
Rozman et al.

(10) Patent No.: US 9,466,983 B2
(45) Date of Patent: Oct. 11, 2016

(54) AUXILIARY WINDING FOR EXTENDED CURRENT MEASUREMENT

(71) Applicant: Hamilton Sundstrand Corporation, Windsor Locks, CT (US)

(72) Inventors: Gregory I. Rozman, Rockford, IL (US); Steven J. Moss, Rockford, IL (US); Jacek F. Gieras, Glastonbury, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 713 days.

(21) Appl. No.: 13/903,189

(22) Filed: May 28, 2013

(65) Prior Publication Data

US 2014/0354049 A1    Dec. 4, 2014

(51) Int. Cl.
| | | |
|---|---|---|
| *H02J 1/10* | (2006.01) | |
| *H02J 3/46* | (2006.01) | |
| *H02J 3/00* | (2006.01) | |
| *H02H 1/00* | (2006.01) | |
| *H02H 3/08* | (2006.01) | |
| *G01R 19/00* | (2006.01) | |
| *G01R 15/18* | (2006.01) | |

(52) U.S. Cl.
CPC ............. *H02J 3/00* (2013.01); *G01R 19/00* (2013.01); *H02H 1/0007* (2013.01); *H02H 3/08* (2013.01); *G01R 15/185* (2013.01); *Y10T 307/352* (2015.04); *Y10T 307/549* (2015.04)

(58) Field of Classification Search
CPC ....... H02J 3/00; G01R 19/00; G01R 15/185; G01R 15/202; Y10T 307/352
USPC .......... 307/24, 52; 324/110, 127; 361/38, 64
See application file for complete search history.

(56) References Cited

U.S. PATENT DOCUMENTS

| | | | | |
|---|---|---|---|---|
| 4,255,705 A | * | 3/1981 | Milkovic | G01R 15/185 323/357 |
| 4,278,940 A | * | 7/1981 | Milkovic | G01R 22/066 323/357 |
| 4,847,554 A | * | 7/1989 | Goodwin | H01F 27/427 324/119 |
| 4,914,383 A | | 4/1990 | Wilkerson | |
| 5,075,628 A | * | 12/1991 | Schuster | H02H 3/17 324/117 H |

(Continued)

OTHER PUBLICATIONS

European Search Report dated Oct. 1, 2014, for corresponding European Patent Application No. 14169823.3.

*Primary Examiner* — Rexford Barnie
*Assistant Examiner* — Rasem Mourad
(74) *Attorney, Agent, or Firm* — Kinney & Lange, P.A.

(57) ABSTRACT

A power controller controls power to a load and includes a primary current sensor, a controller and a current source. The primary current sensor includes a primary conductor and an auxiliary conductor. The primary conductor carries a primary current to the load and the auxiliary conductor carries an auxiliary current in the opposite direction of the primary current to provide partial flux cancellation. The primary current sensor provides an output voltage based upon a magnetic field generated by the primary current and auxiliary current. The controller determines the primary current based upon the output voltage and the auxiliary current. The current source provides the auxiliary current. The controller controls the current source to provide the auxiliary current to the auxiliary conductor if the primary current is greater than a threshold value.

13 Claims, 2 Drawing Sheets

(56) References Cited

U.S. PATENT DOCUMENTS

| | | | |
|---|---|---|---|
| 5,150,270 A * | 9/1992 | Ernst | H02H 1/0007 323/357 |
| 7,242,157 B1 * | 7/2007 | Edel | G01R 15/185 315/362 |
| 7,256,574 B2 | 8/2007 | Teulings et al. | |
| 7,564,147 B2 | 7/2009 | Michalko | |
| 8,390,151 B2 | 3/2013 | Rozman et al. | |
| 9,188,610 B1 * | 11/2015 | Edel | G01R 15/183 |
| 2009/0108833 A1 * | 4/2009 | Ziegler | G01R 15/185 324/117 R |
| 2012/0007425 A1 | 1/2012 | Rozman et al. | |
| 2013/0049465 A1 | 2/2013 | Rozman et al. | |
| 2013/0050880 A1 | 2/2013 | Rozman et al. | |
| 2013/0050890 A1 | 2/2013 | Rozman et al. | |
| 2014/0022829 A1 * | 1/2014 | Shi | H02M 1/4258 363/84 |

* cited by examiner

AUXILIARY WINDING FOR EXTENDED CURRENT MEASUREMENT

BACKGROUND

Solid state power controllers (SSPCs) are often used in power distribution systems to protect electrical systems from overload conditions. SSPCs often employ $I^2t$ over-current protection. $I^2t$ protection allows over-currents for a short amount of time based upon a threshold power flow. These over-currents may be, for example, 800% to 1000% of the steady-state current. Because of this, the SSPCs are required to have a high accuracy current sensor with a wide measuring range. For example, if a steady-state current is 200 amps, the current sensor must be able to accurately sense up to 2000 amps.

In the past, resistive shunts and Hall effect sensors have been used for current sensing in SSPCs. Resistive shunts, however, have power losses that can be quite high when required to support large over-currents. Hall effect sensors are non-contact sensors that sense current based upon a magnetic field created by current flowing in a conductor. These sensors include a core that is implemented around the conductor in which most of the magnetic field generated by the current is concentrated. The core includes an air gap, with a Hall effect device mounted in the air gap of the core at a right angle to the concentrated magnetic field. The Hall effect device produces a voltage that is proportional to the current in the conductor. The larger the current in the conductor, the larger the size of the Hall effect sensor that is required in order to provide accurate measurements. It is desirable to limit the size of these current sensors in order to reduce the size and weight of the SSPC.

SUMMARY

A power controller controls power to a load and includes a primary current sensor, a controller and a current source. The primary current sensor includes a primary conductor and an auxiliary conductor. The primary conductor carries a primary current to the load and the auxiliary conductor carries an auxiliary current in the opposite direction of the primary current to provide partial flux cancellation. The primary current sensor provides an output voltage based upon a magnetic field generated by the primary current and auxiliary current. The controller determines the primary current based upon the output voltage and the auxiliary current. The current source provides the auxiliary current. The controller controls the current source to provide the auxiliary current to the auxiliary conductor if the primary current is greater than a threshold value.

DETAILED DESCRIPTION

A solid state power controller (SSPC) is disclosed herein that utilizes a current sensor with an auxiliary winding for partial flux cancellation for extended measuring range. Each SSPC includes a primary current sensor and controller utilized to monitor for overload conditions and control power to a respective load. The primary current sensor, which may be a Hall effect sensor, includes a primary conductor and an auxiliary conductor. The primary conductor carries a primary current to the load and the auxiliary conductor receives an auxiliary current from a current source in the opposite direction of the primary current to provide partial flux cancellation. The auxiliary conductor may be implemented as a winding with multiple turns to provide greater flux cancellation for a given magnitude of auxiliary current. During steady-state conditions, no auxiliary current is provided to the auxiliary conductor and the output voltage from the sensor is directly proportional to the primary current. When an over-current of, for example, 200% to 1000% of the steady-state current is detected, the current source is controlled by the controller to provide the auxiliary current to the auxiliary conductor of the current sensor. This provides partial flux cancellation for the magnetic core of the sensor, which prevents saturation of core for larger primary currents. When receiving the auxiliary current, the output voltage of the sensor is decreased for a given primary current due to the partial flux cancellation. When auxiliary current is being provided to the auxiliary winding, the microcontroller can determine the primary current based upon the Hall voltage and the magnitude of the auxiliary current. The auxiliary current may be determined by the controller, or may be sensed using an auxiliary current sensor. This way, the primary current can be accurately sensed for both steady-state currents and over-currents using a smaller current sensor than would be necessary without the auxiliary winding.

Figure 1:
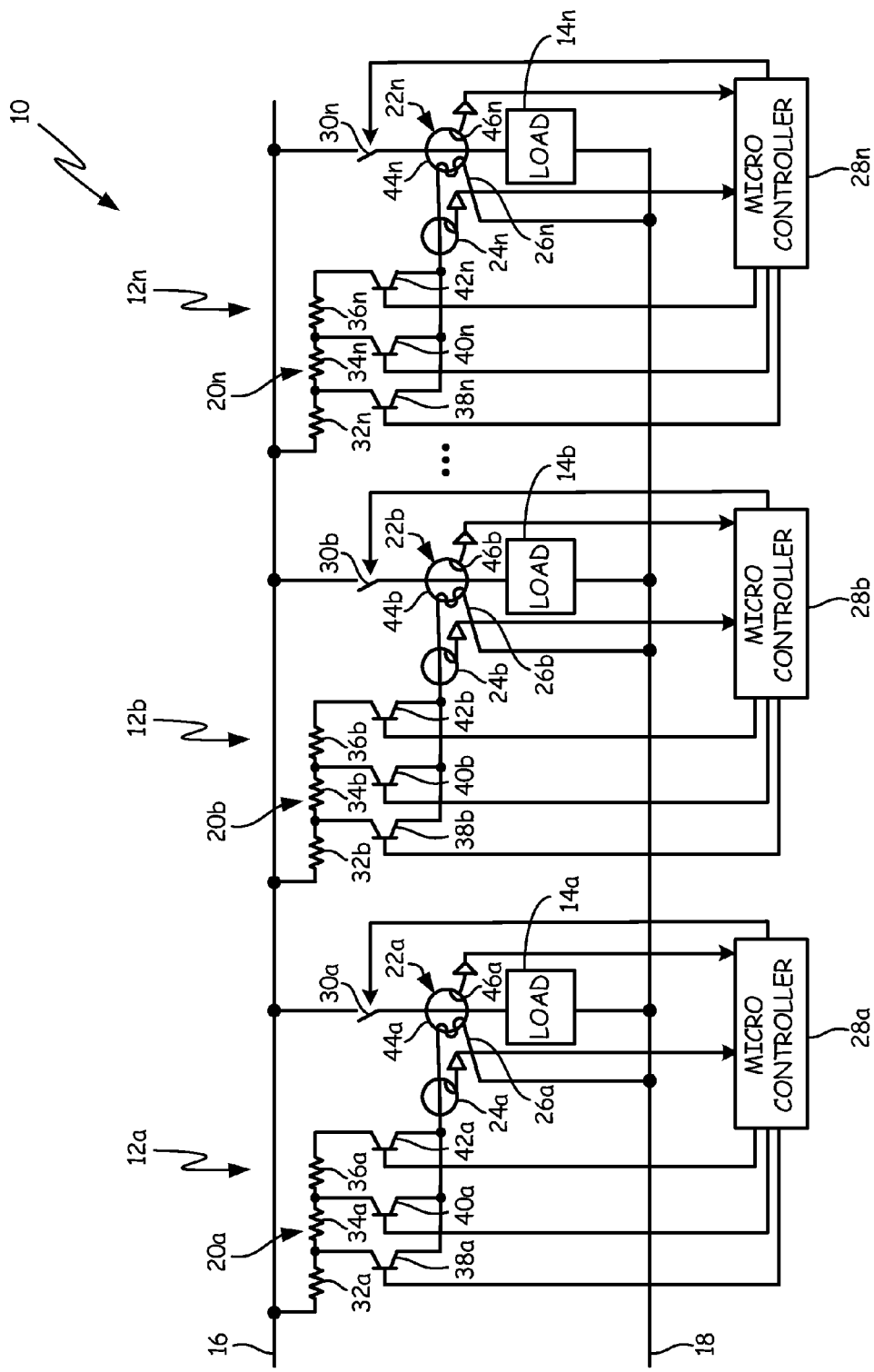
FIG. 1 is a circuit diagram illustrating a system for sensing current in solid state power controllers using partial flux cancellation for extended measuring range.

FIG. 1 is a circuit diagram illustrating system 10 for sensing current in SSPCs 12a-12n using partial flux cancellation for extended measuring range. System 10 includes loads 14a-14n, positive rail 16, and negative rail 18. Positive rail 16 and negative rail 18 receive power from any DC power source. System 10 may include any number of SSPCs 12a-12n and loads 14a-14n. SSPC 12a includes current source 20a, current sensors 22a and 24a, auxiliary winding 26a, microcontroller 28a, and switch 30a. SSPC 12b includes current source 20b, current sensors 22b and 24b, auxiliary winding 26b, microcontroller 28b, and switch 30b. SSPC 12n includes current source 20n, current sensors 22n and 24n, auxiliary winding 26n, microcontroller 28n, and switch 30n. Switches 30a-30n may be any known power switches, such as power metal-oxide-semiconductor field-effect transistors (MOSFETs). Current sensor 22a includes core 44a and Hall effect device 46a. Current sensor 22b includes core 44b and Hall effect device 46b, and current sensor 22n includes core 44n and Hall effect device 46n. Current source 20a includes resistors 32a, 34a, and 36a, and switches 38a, 40a, and 42a. Current source 20b includes resistors 32b, 34b, and 36b, and switches 38b, 40b, and 42b. Current source 20n includes resistors 32n, 34n, and 36n, and switches 38n, 40n, and 42n.

Current sensor 22a senses current to load 14a to monitor, for example, for overload conditions. Because the current during overload conditions may be, for example, 200% to 1000% of the steady-state current, sensor 22a is implemented to accurately sense current both within this range, as well as during steady-state conditions. Current sensor 22a is any current sensor that senses current based upon a magnetic field generated by the current, such as a Hall effect sensor. Hall effect sensors provide an output voltage from Hall effect device 46a directly proportional to the current flowing through the Hall effect sensor based upon a concentrated magnetic field in core 44a. Current sensor 22a provides the output voltage to microcontroller 28a.

Current sensor 22a includes auxiliary winding 26a which provides partial flux cancellation for current sensor 22a. Because current sensor 22a senses current based upon the magnetic field generated by the primary current to load 14a, partial flux cancellation is achieved by providing current to auxiliary winding 26a in the opposite direction of the primary current to load 14a. This reduces the magnitude of the magnetic field concentrated in magnetic core 44a of current sensor 22a for a given primary current to load 14a. The amount of partial flux cancellation is based upon both the magnitude of the auxiliary current in winding 26a and the number of turns of auxiliary winding 26a.

Auxiliary winding 26a receives no current when the primary current to load 14a is less than a threshold value. This threshold value may be, for example, 200% of the steady-state current. When no current is being provided to auxiliary winding 26a, microcontroller 28a determines the current to load 14a based upon the provided output voltage of current sensor 22a. When the determined current is greater than the threshold value, microcontroller 28a controls current source 20a to enable current to auxiliary winding 26a. In the present embodiment, microcontroller 28a can enable switches 38a, 40a, and 42a separately to vary the current from current source 20a depending upon the desired auxiliary current. Enabling switch 38a provides a path to ground through only resistor 32a, which creates the greatest possible current to auxiliary winding 26a. Enabling only switch 40a provides a path to ground through both resistors 34a and 36a, providing a smaller current to auxiliary winding 26a. Enabling only switch 42a provides a path to ground through all resistors 32a, 34a and 36a providing an even smaller current to auxiliary winding 26a. Microcontroller 28a enables switches 38a, 40a, and 42a to provide a desired current based upon the determined current from current sensor 22a. Switches 38a, 40a, and 42a are any known switches such as, for example, insulated gate bipolar transistors (IGBTs).

Because the partial flux cancellation decreases the output voltage of current sensor 22a without decreasing the current to load 14a, the current to load 14a is determined using the output voltage from current sensor 22a as well as the auxiliary current from current source 20a and the number of turns of auxiliary winding 26a. The primary current to load 14a may be determined by microcontroller 28a using either a closed loop or an open loop approach. If using an open loop approach, microcontroller 28a determines the current to auxiliary winding 26a according to the following equation:

$$I_P = \frac{1}{k_H} V_H + I_A \times n \quad \text{(Eq. 1)}$$

Where:
$I_P$=primary current to load 14a.
$k_H$=sensor gain of current sensor 22a (volts/amp).
$V_H$=Hall voltage provided by current sensor 22a.
$I_A$=current to auxiliary winding 26a determined below using Table 1.
n=number of turns in auxiliary winding 26a.

Microcontroller 28a determines the current to auxiliary winding 26a using known values within current source 20a. Current sensor 24a is not necessary when using the open loop approach because microcontroller 28a determines the auxiliary current based upon known values within system 10. The following table shows the equations used to determine the auxiliary current based upon the switch states of switches 38a, 40a, and 42a of current source 20a:

TABLE 1

| $S_3$ | $S_2$ | $S_1$ | $I_A$ |
|---|---|---|---|
| 0 | 0 | 0 | 0 |
| 0 | 0 | 1 | $\frac{V_{DC}}{R_1}$ |
| 0 | 1 | 0 | $\frac{V_{DC}}{R_1 + R_2}$ |
| 0 | 1 | 1 | $\frac{V_{DC}}{R_1}$ |
| 1 | 0 | 0 | $\frac{V_{DC}}{R_1 + R_2 + R_3}$ |
| 1 | 0 | 1 | $\frac{V_{DC}}{R_1}$ |
| 1 | 1 | 0 | $\frac{V_{DC}}{R_1 + R_2}$ |
| 1 | 1 | 1 | $\frac{V_{DC}}{R_1}$ |

Where:
$V_{DC}$=bus voltage on positive rail 16.
$R_1$, $R_2$, and $R_3$=resistance of resistors 32a, 34a, and 36a respectively.
$S_1$, $S_2$, and $S_3$=switching states of transistors 38a, 40a, and 42a respectively (1: conducting; 0: not conducting).

A closed loop approach may also be implemented by microcontroller 28a to determine the primary current to load 14a. In this embodiment, current sensor 24a is used to sense the auxiliary current to winding 26a. Current sensor 24a provides an output voltage to microcontroller 28a directly proportional to the current to auxiliary winding 26a. Microcontroller 28a then determines the primary current using the following equation:

$$I_P = \frac{1}{k_H} V_H + \frac{1}{k_A} V_A \times n \quad \text{(Eq. 2)}$$

Where:
$I_P$=primary current to load 14a.
$k_H$=sensor gain of current sensor 22a (volts/amp).
$V_H$=Hall voltage provided by current sensor 22a.
$k_A$=sensor gain of current sensor 24a (volts/amp).
$V_A$=Hall voltage provided by current sensor 24a.
n=number of turns in auxiliary winding 26a.

Microcontroller 28a controls power switch 30a based upon the determined primary current to load 14a. Microcontroller 28a may implement, for example, $I^2t$ protection. If the power flow over time reaches a threshold value, microcontroller can turn off power switch 30a to stop power flow to load 14a. SSPCs 12b-12n operate in the same manner as SSPC 12a and are therefore not described herein.

Figure 2:
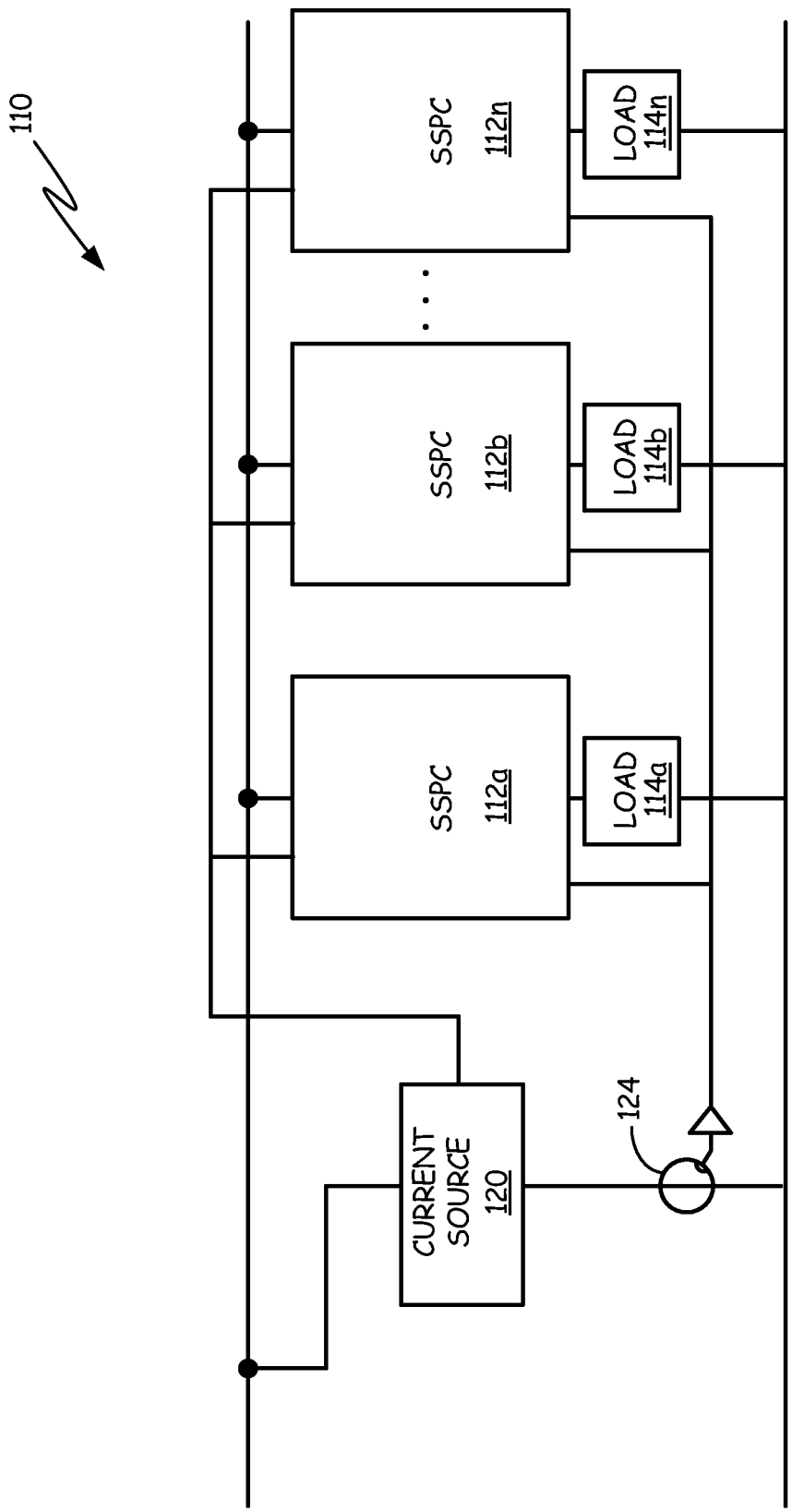
FIG. 2 is a circuit diagram illustrating a system for sensing current in solid state power controllers using a shared current source for all solid state power controllers.

FIG. 2 is a circuit diagram illustrating a system 110 for sensing current in solid state power controllers 112a-112n using shared current source 120 for all solid state power controllers 112a-112n. Solid state power controllers 112a-112n operate in the same manner as solid state power controllers 12a-12n of FIG. 1 except that they share current source 120 and current sensor 124 instead of each having individual current sources 20a-20n and current sensors 24a-24n. Current source 120 and current sensor 124 operate in the same manner as current source 20a and current sensor 24a of FIG. 1. Because it is unlikely to have overload conditions in multiple loads 114a-114n at the same time, by only including one shared current source 120 and current sensor 124, the size of each solid state power controller 112a-112n can be reduced.

The following are non-exclusive descriptions of possible embodiments of the present invention.

A power controller controls power to a load and includes, among other things, a primary current sensor, a controller and a current source. The primary current sensor includes a primary conductor and an auxiliary conductor. The primary conductor carries a primary current to the load and the auxiliary conductor carries an auxiliary current in the opposite direction of the primary current to provide partial flux cancellation. The primary current sensor provides an output voltage based upon a magnetic field generated by the primary current and auxiliary current. The controller determines the primary current based upon the output voltage and the auxiliary current. The current source provides the auxiliary current. The controller controls the current source to provide the auxiliary current to the auxiliary conductor if the primary current is greater than a threshold value.

The power controller of the preceding paragraph can optionally include, additionally and/or alternatively, any one or more of the following features, configurations and/or additional components:

An auxiliary current sensor that senses the auxiliary current and provides a sensed auxiliary current value to the controller.

The primary current sensor and auxiliary current sensor are Hall effect sensors.

The current source includes a first switch enabled to provide a first magnitude current from a power bus. The auxiliary current is equal to the first magnitude current.

The current source further includes a second switch enabled to provide a second magnitude current that is less than the first magnitude current. The auxiliary current is equal to the second magnitude current.

A power switch. The controller controls the power switch to control power to the first load based upon the primary current.

The auxiliary conductor is an auxiliary winding having multiple turns.

A method includes, among other things: providing a first output voltage from a primary current sensor that includes a primary conductor and an auxiliary conductor. The primary conductor carries a primary current to a load and the auxiliary conductor carries zero current. The first output voltage is directly proportional to the primary current. The method further includes determining if the primary current is greater than a threshold value based upon the first output voltage, and controlling a current source to provide an auxiliary current to the auxiliary conductor of the primary current sensor if the primary current is greater than the threshold value. The auxiliary current is in the opposite direction of the primary current to provide partial flux cancellation for the current sensor. The method further includes providing a second output voltage from the primary current sensor based upon the primary current and the auxiliary current, and determining the primary current to the load based upon the second output voltage and the auxiliary current.

The method of the preceding paragraph can optionally include, additionally and/or alternatively, any one or more of the following features, configurations and/or additional components:

The auxiliary conductor of the primary current sensor is an auxiliary winding that includes multiple turns.

The method further includes controlling a power switch to control power to a load based upon the primary current.

Determining the primary current to the load based upon the second output voltage includes providing a third output voltage from an auxiliary current sensor that is directly proportional to the auxiliary current.

The primary current sensor and the auxiliary current sensor are Hall effect sensors.

A system includes, among other things: a plurality of power controllers that control power to respective loads, and a current source. Each of the plurality of power controllers includes a primary current sensor and a controller. The primary current sensor includes a primary conductor and an auxiliary conductor. The primary conductor carries a primary current to the respective load and the auxiliary conductor carries an auxiliary current in the opposite direction of the primary current to provide partial flux cancellation. The primary current sensor provides an output voltage based upon a magnetic field generated by the primary current and auxiliary current. The controller determines the primary current based upon the output voltage and the auxiliary current. The current source is controlled by the controllers of the power controllers to provide the auxiliary current to the auxiliary conductors of the primary current sensors of the plurality of power controllers.

The system of the preceding paragraph can optionally include, additionally and/or alternatively, any one or more of the following features, configurations and/or additional components:

An auxiliary current sensor that senses the auxiliary current from the current source.

The plurality of power controllers each further include a power switch. The controller controls the power switch to control power to the respective load based upon the primary current.

The auxiliary conductors of the primary current sensors of the plurality of power controllers are auxiliary windings having multiple turns.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A power controller that controls power to a load, the power controller comprising:
   a primary current sensor that includes a primary conductor and an auxiliary conductor, wherein the primary conductor carries a primary current to the load and the auxiliary conductor carries an auxiliary current in the opposite direction of the primary current to provide partial flux cancellation, and wherein the primary current sensor provides an output voltage based upon a magnetic field generated by the primary current and the auxiliary current;

a controller that determines the primary current based upon the output voltage and the auxiliary current;

a power switch, wherein the controller controls the power switch to control the power to the load based upon the primary current; and a current source that provides the auxiliary current, wherein the controller controls the current source to only provide the auxiliary current to the auxiliary conductor if the primary current is greater than a first threshold value;

wherein the controller is configured to command the power switch off to disable the power to the load if a total power to the load over a time period is greater than a second threshold value.

2. The power controller of claim 1, further comprising an auxiliary current sensor that senses the auxiliary current and provides a sensed auxiliary current value to the controller.

3. The power controller of claim 2, wherein the primary current sensor and auxiliary current sensor are Hall effect sensors.

4. The power controller of claim 1, wherein the current source comprises a first switch enabled to provide a first magnitude current from a power bus, wherein the auxiliary current is equal to the first magnitude current.

5. The power controller of claim 4, wherein the current source further comprises a second switch enabled to provide a second magnitude current that is less than the first magnitude current, wherein the auxiliary current is equal to the second magnitude current.

6. The power controller of claim 1, wherein the auxiliary conductor is an auxiliary winding having multiple turns.

7. A method comprising: providing a first output voltage from a primary current sensor that includes a primary conductor that carries a primary current to a load, and an auxiliary conductor that carries zero current, wherein the first output voltage is directly proportional to the primary current;

determining if the primary current is greater than a first threshold value based upon the first output voltage; controlling a current source to provide an auxiliary current to the auxiliary conductor of the primary current sensor if the primary current is greater than the first threshold value, wherein the auxiliary current is in the opposite direction of the primary current to provide partial flux cancellation for the current sensor; providing a second output voltage from the primary current sensor based upon the primary current and the auxiliary current; determining the primary current to the load based upon the second output voltage and the auxiliary current; determining a total power over a time period to the load based upon the primary current to the load; and commanding a power switch off to disable the power to the load if the total power over the time period is greater than a second threshold.

8. The method of claim 7, wherein the auxiliary conductor of the primary current sensor is an auxiliary winding that includes multiple turns.

9. The method of claim 7, wherein determining the primary current to the load based upon the second output voltage comprises providing a third output voltage from an auxiliary current sensor that is directly proportional to the auxiliary current.

10. The method of claim 9, wherein the primary current sensor and the auxiliary current sensor are Hall effect sensors.

11. A system comprising:
a plurality of power controllers that control power to respective loads, each of the plurality of power controllers comprising:
  a primary current sensor that includes a primary conductor and an auxiliary conductor, wherein the primary conductor carries a primary current to the respective load and the auxiliary conductor carries an auxiliary current in the opposite direction of the primary current to provide partial flux cancellation, and wherein the primary current sensor provides an output voltage based upon a magnetic field generated by the primary current and auxiliary current;
  a controller that determines the primary current based upon the output voltage and the auxiliary current; and
  a power switch, wherein the controller controls the power switch to control the power to the respective load based upon the primary current, and wherein the controller is configured to command the power switch off to disable the power to the respective load if a total power to the respective load over a time period is greater than a threshold value; and
a current source controlled by the controllers of the plurality of power controllers to provide the auxiliary current to the auxiliary conductors of the primary current sensors of the plurality of power controllers.

12. The system of claim 11, further comprising an auxiliary current sensor that senses the auxiliary current from the current source.

13. The system of claim 11, wherein the auxiliary conductors of the primary current sensors of the plurality of power controllers are auxiliary windings having multiple turns.

* * * * *